United States Patent [19]
Naffziger

[11] Patent Number: 5,949,825
[45] Date of Patent: Sep. 7, 1999

[54] REGENERATIVE CLAMP FOR MULTI-DROP BUSSES

[75] Inventor: Samuel D. Naffziger, Ft. Collins, Colo.

[73] Assignee: Hewlett-Packard Co., Palo Alto, Calif.

[21] Appl. No.: 08/932,438

[22] Filed: Sep. 17, 1997

[51] Int. Cl.⁶ .............. H04B 3/00; H04L 23/00; H03K 17/16; H03K 5/08
[52] U.S. Cl. .............. 375/257; 375/377; 326/30; 326/86; 327/309; 327/310
[58] Field of Search .................. 375/257, 377; 326/30, 21, 86, 27, 26; 333/17.3, 32; 327/310, 309, 180, 321

[56] References Cited

U.S. PATENT DOCUMENTS

| 5,485,107 | 1/1996 | Lacey et al. | 326/30 |
| 5,514,979 | 5/1996 | Collins et al. | 326/30 |
| 5,546,016 | 8/1996 | Allen | 326/30 |
| 5,585,740 | 12/1996 | Tipon | 326/30 |

Primary Examiner—Stephen Chin
Assistant Examiner—Betsy L. Deppe
Attorney, Agent, or Firm—Alexander J. Neudeck

[57] ABSTRACT

Reflections on bus stubs are reduced by sensing when transition occurs on the bus. When a transition is detected, an impedance matched clamp device is activated that clamps the signal to the new (post-transition) voltage for a short period of time. This clamping action reduces the energy in the reflected wave which reduces the ability of the reflected wave to change the voltage on the bus. A receiver detects when a transition occurs on the bus. The output of the receiver is coupled to a delay device. Logic gates combine the output of the delay device with the output of the receiver to produce two pulsed outputs. One pulsed output is pulsed in response to a low-to-high transition on the bus, the other pulsed output is pulsed in response to a high-to-low transition on the bus. These pulsed outputs control the clamp devices so that the clamp devices are only turned on for a short period of time.

11 Claims, 3 Drawing Sheets

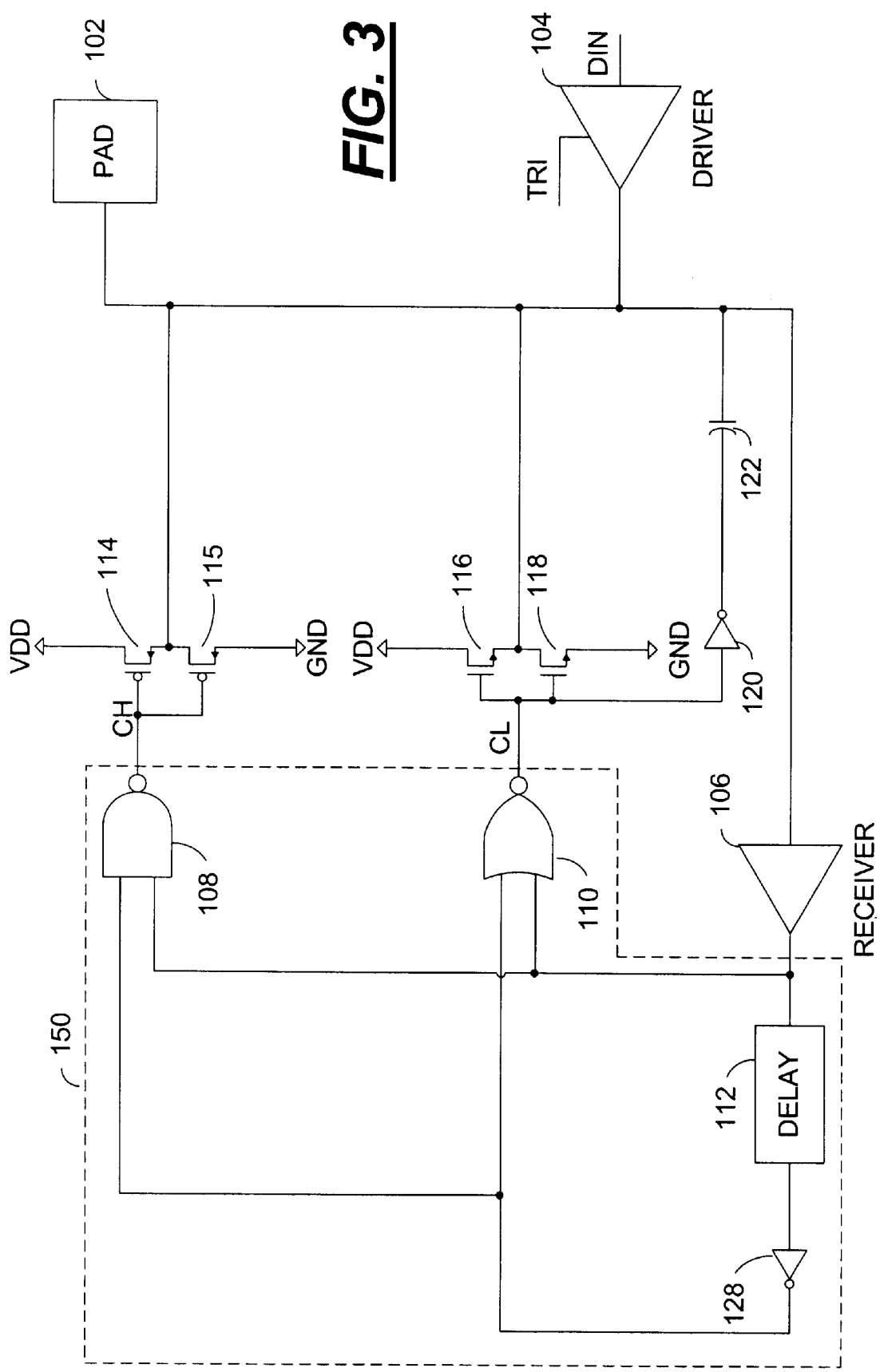

REGENERATIVE CLAMP FOR MULTI-DROP BUSSES

BACKGROUND OF THE INVENTION

1. Field of the Invention

This invention relates to electronic circuits. In particular, this invention relates to input/output circuits on integrated circuits. More particularly, this invention relates to a circuit for reducing overshoot and undershoot on high speed signals that are interconnected between several integrated circuits.

2. Background of the Invention

Multiple integrated circuit devices are often all connected to a common signal. One example of this is a data line on a microprocessor connected to multiple dynamic random access memory (DRAM) chips. To simplify the layout of the printed circuit board, the traces connecting all of these chips may be routed as a main trunk line with smaller "stubs" branching off of that trunk line to connect to each individual device. This is often called a bus. Although convenient, this arrangement can cause severe glitches and signal integrity problems. This is particularly true when the rise or fall time of the signal is less than the propagation time of the signal down a stub. Signal integrity problems arise when a fast rising or falling signal is reflected off the open circuit impedance of the end of a stub and propagated back down the stub onto the trunk line. These reflections dynamically add to, and subtract from, the desired voltage on the signal at all locations on the bus, possibly causing glitches to appear and increasing settling time.

Accordingly, there is a need in the art for an improved way of reducing reflections on bus stubs. Such a way should not involve slowing the rise or fall time of the signal because that would slow the overall speed of the bus down. Furthermore, such a way should not reduce the voltage swing on the bus because this reduces the noise immunity of the bus. These and other needs are accomplished by the present invention.

SUMMARY OF THE INVENTION

The present invention reduces reflections on each bus stub by sensing when a low to high or high to low transition occurs on the bus. When a transition is detected, an impedance matched clamp device is activated that clamps the signal to the new (post-transition) voltage for a short period of time. This clamping action reduces the energy in the reflected wave which reduces the ability of the reflected wave to change the voltage on the bus. Each non-driving device at the end of a bus stub performs this clamping action. This minimizes the effect of all the stubs on the signal integrity.

BRIEF DESCRIPTION OF THE DRAWINGS

FIG. 3 is a schematic representation of an alternate circuit that implements the present invention.

DETAILED DESCRIPTION

Figure 2:
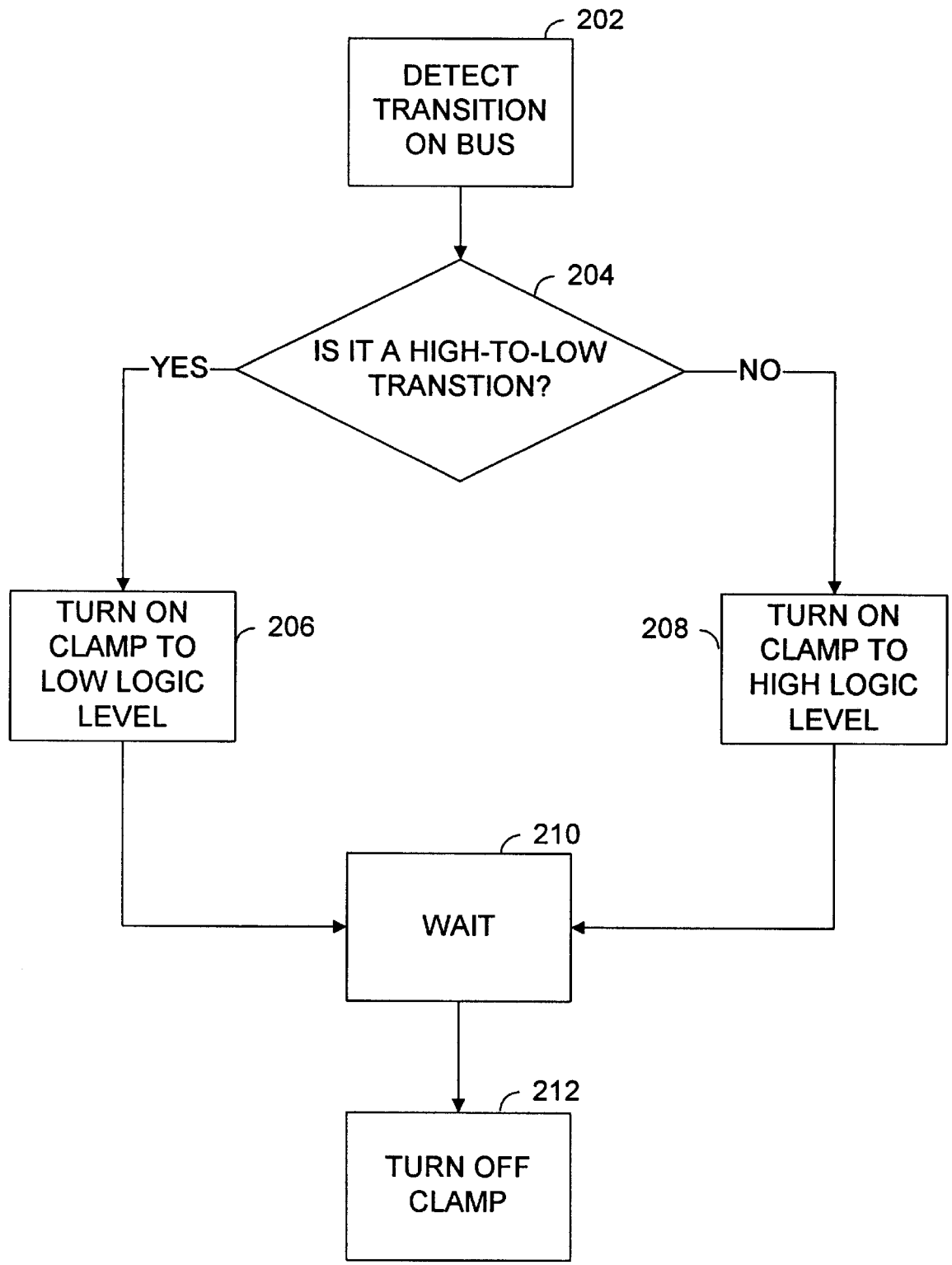
FIG. 2 is a flowchart illustrating the steps taken by the present invention to reduce the energy in the reflected wave.

The steps taken to reduce the energy in the reflected wave are shown in FIG. 2. First, a device at the end of a stub detects when a transition has occurred on the bus 202. It determines if it is a high-to-low or a low-to-high transition 204. If it is a high-to-low transition, the device turns on a clamp device that ties the bus to the low logic level through a first impedance 206. If it is a low-to-high transition, the device turns on a clamp device that ties the bus to the high logic level through a second impedance 208. The device then waits a period of time while the respective clamp device is on 210. After that period of time, the clamp device that is on, is turned off 212.

Figure 1:
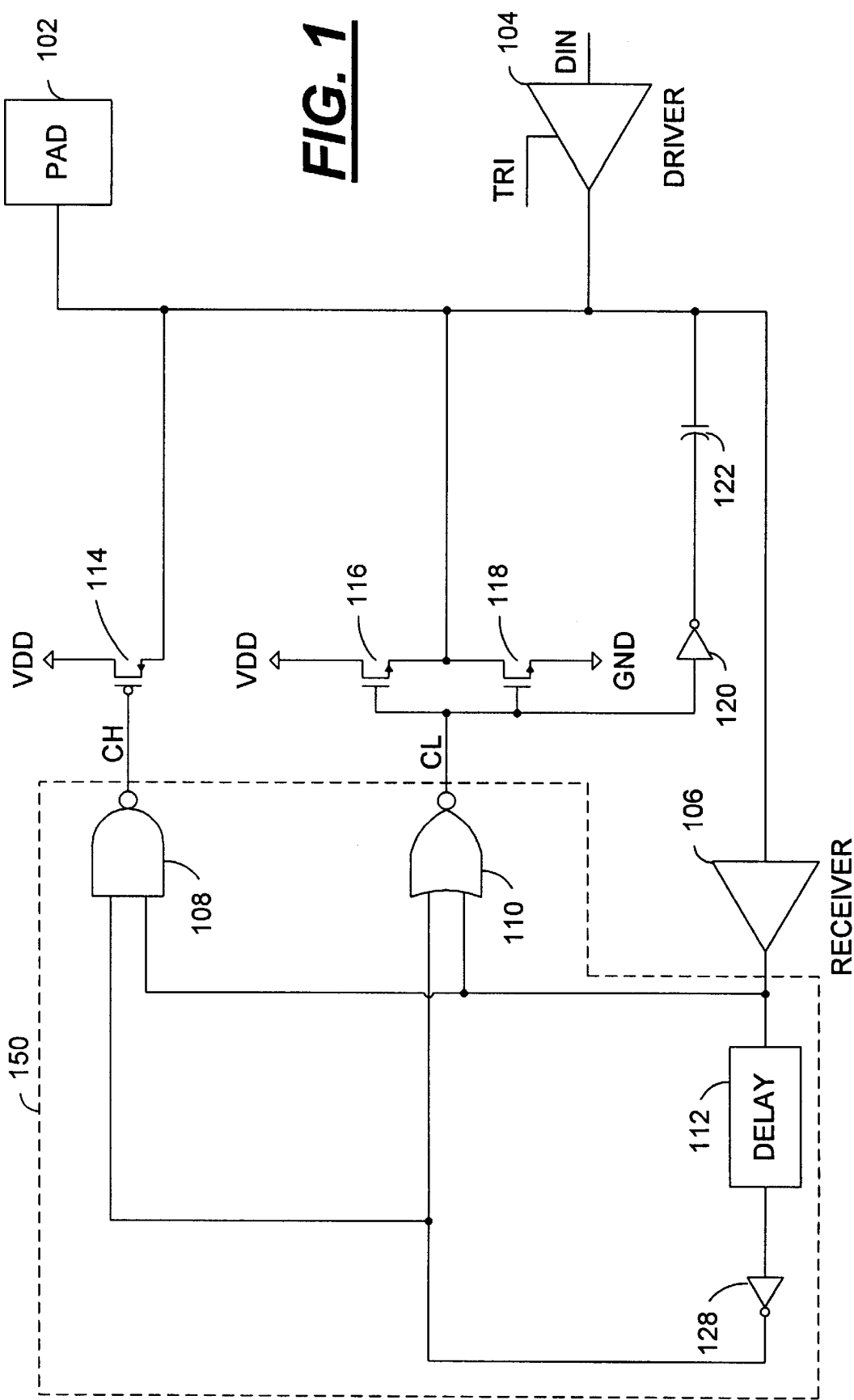
FIG. 1 is a schematic representation of a circuit that implements the present invention.

FIG. 1 is a schematic representation of a circuit that performs the steps in FIG. 2. FIG. 3 is a schematic representation of an alternate circuit that performs the steps in FIG. 2. FIG. 1 is the preferred implementation of this invention. FIG. 3 is an alternate implementation of this invention. Elements in FIG. 3 that correspond with elements in FIG. 1 retain the same labels as those devices in FIG. 1. Pad 102 is electrically connected to the bus. Driver 104 is an optional output driver that would be present on devices that are capable of driving the bus. The output of driver 104 would be connected to pad 102 to drive the bus.

Receiver 106, whose input is connected to pad 102, senses the logic level on the bus. The output of receiver 106 is connected to a pulse generator circuit that is shown inside box 150. The pulse generator circuit 150 produces a pulse on one of two outputs, CH or CL, in response to a change in the output of receiver 106. If the output of receiver 106 indicates that a transition from a low logic level to a high logic level has occurred on the bus, the pulse generator circuit 150 pulses the CH output. If the output of receiver 106 indicates that a transition from a high logic level to a low logic level has occurred on the bus, the pulse generator circuit 150 pulses the CL output.

In a preferred embodiment, the output of receiver 106 is connected to a first input of NAND gate 108, a first input of NOR gate 110, and the input of delay device 112. The output of delay device 112 is connected to the input of inverter 128. The output of inverter 128 is connected to a second input of NAND gate 108 and a second input of NOR gate 110. The output of NAND gate 108 is node CH. The output of NOR gate 110 is node CL. The output of NAND gate 108, node CH, is connected to the gate of a p-channel field effect transistor (PFET) 114. The drain of PFET 114 is connected to the power supply that defines a high logic level. In FIG. 1, this is the positive supply, VDD. The source of PFET 114 is connected to the pad 102. To minimize the reflections on the bus stub connected to pad 102, the dimensions of PFET 114 should be chosen so that when PFET 114 is on its impedance approximates the impedance of the bus stub connected to pad 102.

The delay device 112 may be constructed in several ways. An RC network comprised of a resistor connected between the input and output of the delay device and a capacitor connected from the output to the negative supply, GND, may be used. A plurality of inverters connected in series may also be used. These inverters may be connected to a compensation circuit that adjusts the speed of the inverters to compensate for process, voltage, and temperature variations. To avoid drive fights, the amount of delay the delay device provides should be less than the cycle time of the bus.

The output of NOR gate 110, node CL, is connected to the gates of two n-channel field effect transistors (NFETs) 116 and 118. The drain of NFET 116 is connected to the positive supply voltage, VDD. The source of NFET 116 is connected to pad 102. The drain of NFET 118 is connected to pad 102. The source of NFET 118 is connected to ground.

The series connection of NFETs 116 and 118 form a resistive divider setting the voltage on the pad when both NFETs are on. This resistive divider acts to clamp the bus to a programmable voltage level so that the clamp voltage may match the voltage that defines a low logic level on the bus that is not the negative power supply voltage. If the voltage that defines a low logic level on the bus was equal to the negative power supply voltage, the resistive divider may be replaced by a single transistor. To minimize the reflections on the bus stub connected to pad 102, the dimensions of NFETs 116 and 118 should be chosen so that when NFETs 116 and 118 are on their parallel impedance approximates the impedance of the bus stub connected to pad 102. One skilled in the art would recognize that the Thevenin equivalent circuit of the resistive divider comprised of NFETs 116 and 118 would be a voltage source equal to the low logic level on the bus and the impedance of NFETs 116 and 118 in parallel. Similarly, one skilled in the art would recognize that if the voltage that defines a high logic level on the bus is not the positive power supply voltage, a voltage divider comprised of two PFETs may be substituted for PFET 114 to provide a Thevenin equivalent circuit comprised of a voltage source equal to the high level on the bus and a second impedance. This alternate implementation is illustrated in FIG. 3 with the addition of PFET 115. In FIG. 3, the drain of PFET 115 is connected to the pad 102. The source of PFET 115 is connected to the negative supply, GND. The gate of PFET 115 is connected to node CH.

It may also be desirable to compensate for the charge dumped onto the bus by the gate capacitances of NFETs 116 and 118 when CL switches. This compensation may be accomplished by inverter 120 and capacitor 122. The input to inverter 120 is connected to node CL. The output of inverter 120 is connected to one terminal of capacitor 122. The other terminal of capacitor 122 is connected to the pad 102. When node CL switches, the output of inverter 120 switches in the opposite direction. This causes capacitor 122 to either add, or remove charge from the pad 102 opposite the charge added, or removed, from pad 102 by the gate capacitances of NFETs 116 and 118. In this manner, at least some of the charge dumped onto the pad 102, and hence the bus, is compensated for by inverter 120 and capacitor 122. Likewise, it may be desirable to compensate for the charge dumped onto the bus by the gate capacitance of PFET 114 when CH switches. This may be accomplished by an inverter with its input connected to CH and another capacitor.

It is to be understood that the claimed invention is not to be limited by the preferred embodiments but encompasses other modifications and alterations within the scope and spirit of the inventive concept. For example, the invention has been described in terms of clamping signals on busses with multiple stubs. However, it could easily be used on signal lines that are point-to-point and have no stubs. The described embodiments are to be considered as illustrative and not restrictive, the scope of the invention being indicated by the claims rather than by the foregoing description.

I claim:

1. A method of reducing noise on a signal, comprising the steps of:
   (a) detecting a transition of the signal from a first voltage level to a second voltage level;
   (b) turning on a first clamp device if said second voltage level is within a first range of voltages wherein said first range of voltages define a low logic level, and also wherein said first clamp device is connected to said signal and wherein said first clamp device, when on, functions as a first Thevenin equivalent circuit comprised of a first voltage source and a first impedance between said signal and a first logic reference voltage;
   (c) turning on a second clamp device if said second voltage level is within a second range of voltages wherein said second range of voltages define a high logic level, and also wherein said second clamp device is connected to said signal and wherein said second clamp device, when on, functions as a second Thevenin equivalent circuit comprised of a second voltage source and a second impedance between said signal and a second logic reference voltage;
   (d) waiting a period of time while one of said first clamp device and said second clamp device is on; and,
   (e) turning off the said one of said first clamp device and said second clamp device that is on.

2. An apparatus for reducing noise on a signal, comprising:
   a receiver, said receiver having a receiver output and a receiver input, said receiver input being connected to said signal, said receiver output indicating whether said signal is at a low logic level or a high logic level;
   a pulse generator, said pulse generator having a pulse generator input, a clamp high output, and a clamp low output wherein said pulse generator input is coupled to said receiver output and wherein said clamp high output is responsive to said pulse generator input to generate a first pulse when said pulse generator input indicates said signal has transitioned from a low logic level to a high logic level, and also wherein said clamp low output is responsive to said pulse generator input to generate a second pulse when said pulse generator input indicates said signal has transitioned from a high logic level to a low logic level;
   a first clamp device coupled to said clamp high output wherein said first clamp device, when on, establishes a first non-infinite impedance between said signal and a first power supply node and wherein the voltage on said first power supply node is such that if the voltage on said first power supply node was present on said receiver input, said receiver output would indicate said signal was at said high logic level, and wherein said first clamp device is on only during said first pulse; and
   a second clamp device coupled to said clamp low output wherein said second clamp device, when on, establishes a second non-infinite impedance between said signal and a second power supply node and wherein the voltage on said second power supply node is such that if the voltage on said second power supply node was present on said receiver input, said receiver output would indicate said signal was at said low logic level, and wherein said second clamp device is on only during said second pulse.

3. The apparatus of claim 2, further comprising:
   a third clamp device coupled to said clamp low output wherein said third clamp device, when on, establishes a third non-infinite impedance between said signal and said first power supply node and wherein said third clamp device is on only during said second pulse.

4. The apparatus of claim 3, further comprising:
   a fourth clamp device coupled to said clamp high output wherein said fourth clamp device, when on, establishes a fourth non-infinite impedance between said signal and said second power supply node and wherein said fourth clamp device is on only during said first pulse.

5. The apparatus of claim 4 wherein said pulse generator comprises a delay device having a delay input and a delayed output wherein said delayed output follows said delay input after a delay of a fixed time period and said delay input is coupled to said receiver output.

6. The apparatus of claim 5 wherein said pulse generator further comprises a NAND gate and a NOR gate, said NAND gate and said NOR gate both having inputs that are coupled to both of said receiver output and said delayed output.

7. The apparatus of claim 6 wherein said NAND gate has a NAND output and said NOR gate has a NOR output and wherein said NAND output is said clamp high output and wherein said NOR output is said clamp low output.

8. The apparatus of claim 2 wherein said first clamp device is a field effect transistor and said second clamp device is a field effect transistor.

9. The apparatus of claim 3 wherein said third clamp device is a field effect transistor.

10. The apparatus of claim 4 wherein said fourth clamp device is a field effect transistor.

11. The apparatus of claim 7 wherein said first clamp device is a field effect transistor and said second clamp device is a field effect transistor and said third clamp device is a field effect transistor and said fourth clamp device is a field effect transistor.

* * * * *